(12) United States Patent
Muhammad et al.

(10) Patent No.: US 7,852,247 B2
(45) Date of Patent: Dec. 14, 2010

(54) MIXED-SIGNAL FILTER

(75) Inventors: Khurram Muhammad, Dallas, TX (US); Yongtao Wang, Plano, TX (US); Imtinan Elahi, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/863,999

(22) Filed: Sep. 28, 2007

(65) Prior Publication Data

US 2008/0129569 A1 Jun. 5, 2008

Related U.S. Application Data

(60) Provisional application No. 60/868,580, filed on Dec. 5, 2006.

(51) Int. Cl.
*H03M 3/00* (2006.01)

(52) U.S. Cl. .................. 341/143; 341/118; 341/120; 341/155

(58) Field of Classification Search ........... 341/118, 341/120, 143, 155
See application file for complete search history.

(56) References Cited

U.S. PATENT DOCUMENTS

| | | | |
|---|---|---|---|
| 3,067,996 A | 12/1962 | Theodosiou | |
| 3,228,019 A | 1/1966 | Visceglia | |
| 5,187,482 A * | 2/1993 | Tiemann et al. | 341/143 |
| 5,729,230 A * | 3/1998 | Jensen et al. | 341/143 |
| 6,018,556 A | 1/2000 | Janesch et al. | |
| 6,121,910 A * | 9/2000 | Khoury et al. | 341/143 |
| 6,282,185 B1 | 8/2001 | Hakkinen et al. | |
| 6,418,220 B2 | 7/2002 | Fischer et al. | |
| 6,674,381 B1 * | 1/2004 | Gomez et al. | 341/143 |
| 6,678,709 B1 | 1/2004 | Gandhi et al. | |
| 6,822,592 B2 * | 11/2004 | Gandolfi et al. | 341/143 |
| 6,864,818 B1 | 3/2005 | Hezar | |
| 6,956,517 B1 | 10/2005 | Baker et al. | |
| 7,034,727 B2 * | 4/2006 | Xu | 341/143 |
| 7,042,377 B2 * | 5/2006 | Oliaei | 341/143 |
| 7,058,464 B2 | 6/2006 | Mallinson | |
| 7,061,989 B2 * | 6/2006 | Bellaouar et al. | 375/295 |
| 7,091,894 B2 | 8/2006 | Fudge et al. | |
| 7,155,022 B2 | 12/2006 | Danielsen et al. | |
| 7,183,957 B1 * | 2/2007 | Melanson | 341/143 |
| 7,218,904 B2 | 5/2007 | Staszewski et al. | |
| 7,285,538 B2 * | 10/2007 | Choulika et al. | 514/44 R |
| 7,365,668 B2 * | 4/2008 | Mitteregger | 341/143 |
| 7,420,494 B1 * | 9/2008 | Schreier | 341/143 |
| 7,545,303 B1 * | 6/2009 | Silva et al. | 341/143 |
| 2005/0116850 A1 * | 6/2005 | Hezar et al. | 341/143 |
| 2005/0275576 A1 * | 12/2005 | Fudge et al. | 341/155 |
| 2006/0238395 A1 * | 10/2006 | Nagai et al. | 341/143 |

* cited by examiner

*Primary Examiner*—Linh V Nguyen
(74) *Attorney, Agent, or Firm*—Ronald O. Neerings; Wade James Brady, III; Frederick J. Telecky, Jr.

(57) ABSTRACT

One embodiment of the invention includes a mixed-signal filter. The mixed-signal filter comprises an analog signal path configured to process a first analog signal and an analog-to-digital converter (ADC) configured to convert the processed first analog signal to a digital signal. The mixed-signal filter also comprises a programmable digital feedback filter configured to filter the digital signal and a digital-to-analog converter (DAC) configured to convert the filtered digital signal to a second analog signal. The mixed-signal filter further comprises a signal combiner configured to combine an analog input signal of the mixed-signal filter and the second analog signal to generate the first analog signal.

17 Claims, 4 Drawing Sheets

MIXED-SIGNAL FILTER

RELATED APPLICATION

This application claims the benefit of U.S. Provisional Patent Application No. 60/868,580, which was filed on Dec. 5, 2006, and entitled "A Method and Apparatus for Realizing Complex Filtering Using Real Analog Filters Together with Mixed-Signal Complex Feedback," the entire contents of which are incorporated herein by reference.

TECHNICAL FIELD

This invention relates to electronic circuits, and more specifically to a mixed-signal filter.

BACKGROUND

In the field of communications, particularly wireless voice communications, there is a constant effort to manufacture consumer electronics that allow a clearer signal, such that participants in a communication session can better understand each other. As a result, an incoming communication signal can be filtered to remove unwanted signal power within a given frequency band. As an example, electronic noise and/or interferer signals at frequencies both known and unknown can contribute to such unwanted signal power. Thus, the incoming communication signal can be filtered to attempt to remove the unwanted signal power at specific frequencies in the frequency spectrum of the communication signal.

As the incoming communication signal is first received in the analog domain, some typical filter systems attempt to filter the signal in the analog domain. However, to filter more specific frequencies in the frequency spectrum of a communication signal, analog filter systems can be expensive and bulky, and can involve extremely complicated algorithms to allow them to be tunable to the specific frequency ranges in the frequency spectrum. As incoming communication signals are often converted to the digital domain, some typical filter systems attempt to filter the system in the digital domain. However, while digital filters are typically inexpensive and often involve much simpler algorithms, digital filters may be required to implement extremely high resolution to maintain signal quality of an incoming signal, and can also require an extremely high dynamic range of an upstream analog-to-digital converter (ADC) to be able to receive the incoming signal without losing modulated information. A high dynamic range ADC using existing design techniques is prohibitively expensive, power hungry and bulky, particularly for low-cost and low-power applications, such as mobile stations.

Another manner of filtering that is typically implemented is an adaptive filter algorithm. An adaptive filter algorithm is an algorithm that continuously monitors an output of the adaptive filter to estimate a location of interferer signals. The interferer signals can thus be cancelled based on subtracting power at the estimated locations as the signal is subsequently received. Adaptive filter algorithms, however, are typically very complicated, and can suffer from time delays in filtering the interferers and/or noise, and can be unstable based on the variations and reactions of the filter output. In addition, estimation errors can result in filtering portions of the signal of interest, or possibly undesirably boosting noise and/or interferers based on a lack of convergence of the filter algorithm. As a result, the continuously varying transfer function of the adaptive filter algorithm may not result in accurate filtering of unwanted signal power from a frequency spectrum of an incoming communication signal.

SUMMARY

One embodiment of the present invention includes a mixed-signal filter. The mixed-signal filter comprises an analog signal path configured to process a first analog signal and an analog-to-digital converter (ADC) configured to convert the processed first analog signal to a digital signal. The mixed-signal filter also comprises a programmable digital feedback filter configured to filter the digital signal and a digital-to-analog converter (DAC) configured to convert the filtered digital signal to a second analog signal. The mixed-signal filter further comprises a signal combiner configured to combine an analog input signal of the mixed-signal filter and the second analog signal to generate the first analog signal.

Another embodiment of the present invention includes a method for filtering a first analog signal. The method comprises combining the first analog signal with a second analog signal to generate a combined analog signal and processing the combined analog signal in the analog domain. The method also comprises converting the processed combined analog signal to a digital signal and filtering the digital signal in the digital domain based on a predetermined digital filter transfer function. The method further comprises converting the filtered digital signal to the analog domain to generate the second analog signal.

Another embodiment of the present invention includes a mixed-signal filter. The mixed-signal filter comprises means for combining an analog input signal and a feedback signal to generate an analog combined signal. The mixed-signal filter also includes means for processing the analog combined signal to generate an output signal and means for filtering the output signal in the digital domain to generate the feedback signal based on a predetermined transfer function. The mixed-signal filter further includes means for programming the means for filtering to generate the predetermined transfer function.

By way of further example, in the above embodiments, the mixed-signal filter can be considered a mixed-signal servo loop with negative feedback. The overall closed loop response of the servo loop depends on transfer functions of analog and digital components, as well as signal and noise transfer functions of A/D and D/A converters. The combiner output in such embodiments corresponds to the error signal of the servo loop.

DETAILED DESCRIPTION

The present invention relates to electronic circuits, and more specifically to a mixed-signal filter. The mixed-signal filter receives an analog input signal, such as a downconverted and/or demodulated radio frequency (RF) signal received at an antenna. The analog signal is combined at a signal combiner with a filtered feedback signal. The combined analog signal is provided to an analog signal path that processes the combined signal. The analog signal path can include an analog filter and/or an amplifier to implement the processing of the combined signal. The processed analog signal is converted to the digital domain and input to a programmable digital feedback filter. The programmable digital feedback filter can be set to adjust zeros, poles, and/or gain of the frequency spectrum of the digital signal, such that a transfer function of the mixed-signal filter can be predetermined. The filtered digital signal is converted to the analog domain and is combined with the analog signal upstream from the analog signal path. As a result, a simple analog filter can be combined with a simple digital filter algorithm to generate a static, predetermined transfer function of the filter. Therefore, the mixed-signal filter can be implemented in an affordable and space-saving manner, and does not suffer the shortcomings of adaptive filtering algorithms, such as problems associated with time-delays, convergence, and stability.

Figure 1:
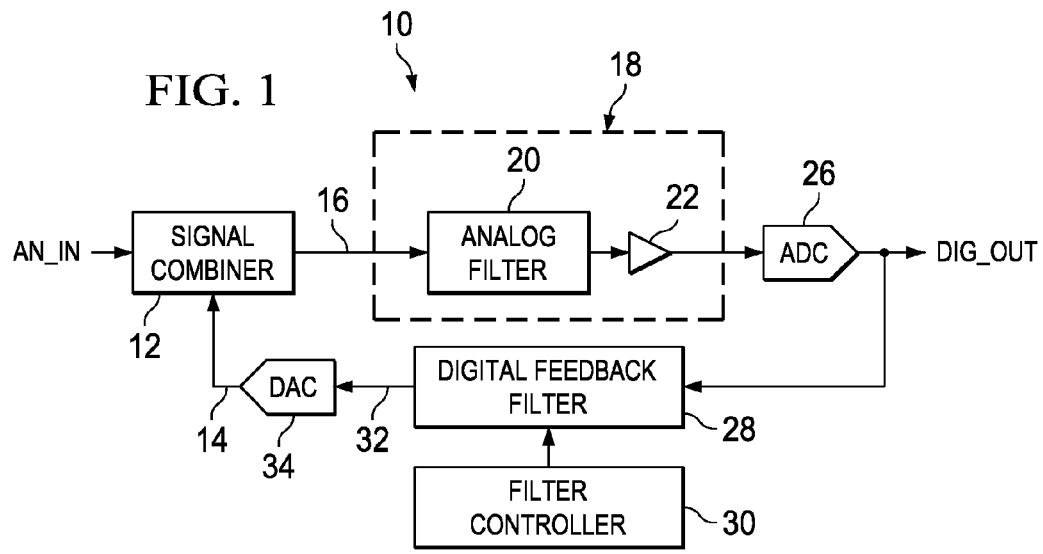
FIG. 1 illustrates an example of a mixed-signal filter in accordance with an aspect of the invention.

FIG. 1 illustrates an example of a mixed-signal filter 10 in accordance with an aspect of the invention. The mixed-signal filter 10 can be configured in any of a variety of communications devices, such as a handheld wireless communications device. For example, the mixed-signal filter 10 can be configured in a wireless receiver, such that the mixed-signal filter 10 can operate to filter downconverted and/or demodulated RF signals received at an antenna.

In the example of FIG. 1, the mixed-signal filter 10 receives an analog input signal AN_IN, which can be an RF signal that is downconverted to an intermediate frequency (IF) analog communication signal. The analog signal AN_IN is provided to a signal combiner 12 configured to combine the analog signal AN_IN with an analog feedback signal 14. The signal combiner 12, for example, can be implemented as a switched-capacitor subtractor system. The combination of the analog signal AN_IN and the analog feedback signal 14 can be performed by the signal combiner 12 in any of a variety of ways. As an example, the analog signal AN_IN and the analog feedback signal 14 can be combined in the voltage domain, the current domain, or the charge domain in which charge on one or more capacitors is combined. The signal combiner 12 can also include one or more additional analog circuit components, such as an attenuator to reduce the combined power of the analog signal AN_IN and the analog feedback signal 14. The signal combiner 12 provides an output that is a combined signal 16.

The combined signal 16 is input to an analog signal path 18 that is configured to process the combined signal 16. In the example of FIG. 1, the analog signal path 18 includes an analog filter 20 and an amplifier 22. The analog filter 20 can be configured as any of a variety of analog filters, such as a switched capacitor filter. As such, the analog filter 20 can be configured as a single-order filter to provide a simple frequency response. The amplifier 22 can be configured as a gain amplifier having a gain factor of greater than or equal to one, or can be configured as an attenuator to reduce the power of the combined signal output from the analog filter 20. Those skilled in the art will understand other types of analog circuitry and/or components that can be arranged to provide means for performing desired processing of the combined signal 16 in the analog domain. Additionally or alternatively, the signal combiner can be considered as part of the analog path 18. The analog signal path 18 thus provides an output signal 24 that is a processed (e.g., filtered and/or amplified) version of the combined signal 16.

The processed analog signal 24 is provided to an analog-to-digital converter (ADC) 26 configured to convert the processed analog signal 24 to the digital domain. As an example, the ADC 26 can be implemented as a flash ADC, a pipelined ADC, a sigma-delta ADC, or any of a variety of different types of ADC. Thus, the ADC 26 generates a digital signal DIG_OUT that is a digital version of the processed analog signal 24. The digital signal DIG_OUT is output from the mixed-signal filter 10, such that it can be provided to any of a variety of additional processing devices, such as down-sampling, synchronization, and/or additional filtering devices. The digital signal DIG_OUT is also provided to a digital feedback filter 28. The digital feedback filter 28 can be configured as a programmable digital filter that is operative to provide further filtering of the digital signal DIG_OUT, in addition to that already performed by the analog filter 20.

The mixed-signal filter 10 also includes a filter controller 30 configured to provide programming commands to the digital feedback filter 28. The filter controller can be implemented as including a register or other storage that can store filter coefficients. Additionally or alternatively, the filter controller can include digital logic, a digital signal processor or an application specific integrated circuit configured to program the digital feedback filter.

As an example, the digital feedback filter 28 can be programmed by the filter controller 30 to set poles, zeros, and/or gain associated with the frequency spectrum of the digital signal DIG_OUT. As a result, interferer signals at a frequency range that is close to the frequency range of the signal of interest in the digital signal DIG_OUT can be removed based on the programming commands provided by the filter controller 30. The filter controller 30 can be configured to set the poles, zeros, and/or gain, such as based on preset commands from associated control circuitry.

The poles, zeros, and/or gain can be defined for a given application by a user or be defined based on a specific known communication format or standard. As an example, upon the wireless communication device that includes the mixed-signal filter 10 communicating in the Global System for Mobile Communications (GSM) standard, the filter controller 30 can be configured to set a zero at a specific frequency based on a known interferer in the GSM frequency band. As another example, the filter controller 30 can be configured to program the digital feedback filter 28 dynamically, such as in response to detecting an interferer signal during run-time operation of the wireless communication device in which the mixed-signal filter 10 is included. Accordingly, the digital feedback filter 28 can be programmed to have a predetermined transfer function corresponding to the frequency spectrum associated with the digital signal DIG_OUT.

The digital feedback filter 28 provides a digitally filtered output signal 32 to a digital-to-analog converter (DAC) 34, which converts the digitally filtered output signal 32 to the analog domain. The DAC 34 can be configured as any of a variety of types of DAC, such as a sigma-delta DAC. The DAC 34 outputs the analog feedback signal 14, which is thus the analog version of the digitally filtered output signal 32. Accordingly, the analog version of the digitally filtered output signal 32 is combined with the analog input signal AN_IN to implement mixed-signal filtering of the analog input signal AN_IN. Specifically, the digital signal DIG_OUT is output from the mixed-signal filter 10 having both analog and digital filtering performed upon it.

Figure 2:
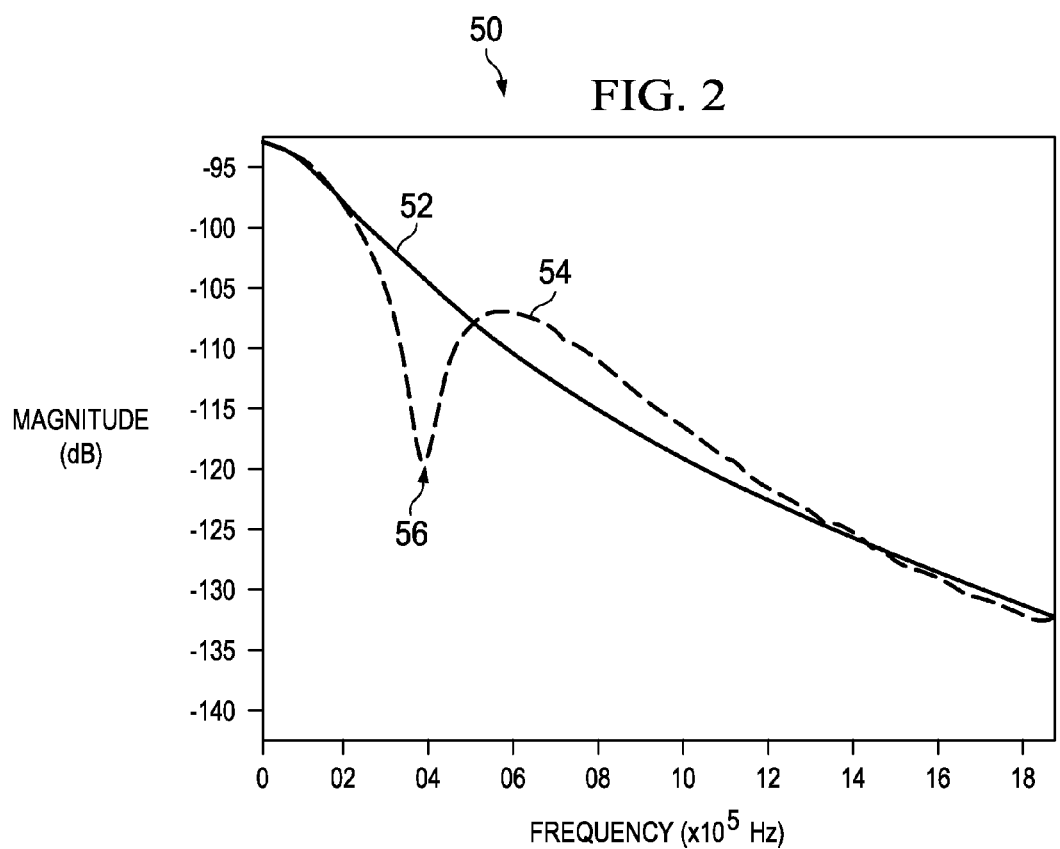
FIG. 2 illustrates an example of a graph of a transfer function of a mixed-signal filter in accordance with an aspect of the invention.

FIG. 2 illustrates an example of a graph 50 of a transfer function of a mixed-signal filter in accordance with an aspect of the invention. The graph 50 can be representative of a transfer function of the mixed-signal filter 10 in the example of FIG. 1. As such, reference will be made to the mixed-signal filter 10 in the example of FIG. 1 in the discussion of the graph 50 in the example of FIG. 2.

The transfer function demonstrated by the graph 50 includes a power spectral density (PSD) function that plots a magnitude of the PSD of the digital output signal DIG_OUT in decibels (dB) over frequency in $10^5$ Hz. The graph 50 demonstrates a first curve 52, indicated in the example of FIG. 2 as a solid line. The first curve 52 can be representative of a transfer function of an open-loop filtering of the analog input signal AN_IN. As an example, the first curve 52 can be representative of a transfer function of the analog filter 20 alone, such as in a configuration that does not include the combination of the feedback signal 14 with the analog input signal AN_IN via the signal combiner 12. Thus, as demonstrated in the example of FIG. 2, the first curve 52 can represent a simple open-loop analog filter transfer function.

The graph 50 also demonstrates a second curve 54, indicated in the example of FIG. 2 as a dashed line. The second curve 54 can be representative of a transfer function of the entire mixed-signal filter 10 of the example of FIG. 1. In the example of FIG. 2, the second curve 54 demonstrates that the digital feedback filter 28 can be configured as a fourth-order real infinite impulse response (IIR) filter. The transfer function of the second curve 54 in the z-domain is represented by Equation 1 below:

$$FBF(z) = \frac{0.4486 - 1.3865z^{-1} + 1.5606z^{-2} - 0.7551z^{-3} + 0.1325z^{-4}}{1 - 2.6149z^{-1} + 2.3431z^{-2} - 0.8244z^{-3} + 0.0995z^{-4}} \quad \text{Equation 1}$$

The transfer function of the second curve 54 can also be express in a zero/pole/gain (zpk) format based on Equation 1 in Equation 2 below:

$$FBF(z) = \quad \text{Equation 2}$$
$$0.4486 \frac{(z-1)(z-0.9912)(z-0.6164)(z-0.4834)}{(z-(0.9921+0.084i))(z-(0.9921-0.084i))(z-(0.3154+0.0302i))(z-(0.3154-0.0302i))}$$

Where $i = \sqrt{-1}$.

As demonstrated in the example of FIG. 2, the digital feedback filter 28 has four zeros on the real axis, and also has four complex poles in two complex-conjugate pairs based on the digital feedback filter 28 being a real filter.

Proper choice of the digital feedback filter 28 can achieve desired signal processing (e.g., enhanced filtering at a certain frequency region) while ensuring stability of the system. For example, to achieve enhanced filtering at a certain frequency region, the digital feedback filter 28 can be configured to provide a gain at that frequency region, such that the overall filter response can include a notch at that frequency region. In addition, proper placement of zeros can add phase compensation, thereby improving loop stability. Furthermore, as described above, the output of the digital feedback filter 28 is converted into an analog signal by the DAC 34. In the example of FIG. 2, the DAC 34 is configured as a second-order sigma-delta DAC. As a result, sigma-delta modulation converts the respective multi-bit digital signal, such as the digitally filtered output signal 32, at a lower rate to an oversampled 1-bit stream. The second-order sigma-delta modulation can be based on the error-feedback structure, such as described in Analog Integrated Circuit Design by D. A. Johns, and K. Martin (New York, John Wiley & Sons, Inc., 1997). As an example, the noise transfer function can be $(1-z^{-1})^2$ and the signal transfer function can be $z^{-1}$.

As an example, the filter controller 30 can program the digital feedback filter 28 to have a zero at approximately 400 kHz. For example, there may be a known and/or detected interferer signal in the analog input signal AN_IN at approximately 400 kHz. Therefore, upon combination of the feedback signal 14 with the analog input signal AN_IN at the signal combiner 12, the zero programmed at approximately 400 kHz combines with the transfer function demonstrated by the first curve 52 to generate an asymptotic notch 56 at approximately 400 kHz. As demonstrated in the example of FIG. 2, the addition of the notch 56 may increase the power along the PSD of the second curve 54, such as between approximately 500 kHz and approximately 1.2 MHz. However, the additional power does not rise above approximately 4 dB from the first curve 52, which can typically be acceptable. Accordingly, the mixed-signal filter 10 can be set with the predetermined transfer function demonstrated by the second curve 54 for the digital output signal DIG_OUT to remove the interferer signal at or near approximately 400 kHz. It will be understood that the filter controller 30 can program the digital feedback filter 28 to have other transfer function characteristics, such as can be defined by the poles, zeros and gain of the filter.

Due to the digital feedback filter 28 being fed back to the input of the mixed-signal filter 10 to implement a closed-loop filtering algorithm, a transfer function of the mixed-signal filter 10, such as the transfer function demonstrated by the second curve 54 in the example of FIG. 2, can be programmably controlled with more accuracy and ease than an equivalent open-loop or adaptive filter algorithm. In addition, the analog processing of the analog signal path 18 allows the signal power of the combined signal 16 to be controlled so as to substantially mitigate saturation of the ADC 26, while the feedback arrangement of the digital feedback filter 28 allows transfer function of the combined signal 16 to be simplistically manipulated, even prior to the analog processing. Therefore, the mixed-signal filter 10 incorporates the benefits and counters the detriments of both analog and digital filtering algorithms individually. Furthermore, by combining the digital filtering component of the digital feedback filter 28 with the analog processing of the analog signal path 18, the mixed-signal filter 10 can be configured to implement complicated and effective filter algorithms without excessive cost and/or die area.

It is to be understood that the mixed-signal filter 10 is not intended to be limited to the example of FIGS. 1 and 2. For example, the analog signal path 18 can be configured in any of a variety of ways. As an example, the analog filter 20 and the amplifier 22 can be arranged in opposite order, such as the amplifier 22 being configured upstream of the analog filter 20, or the analog signal path 18 can be configured with only one of the analog filter 20 and the amplifier 22 as well as with other circuitry. The particular circuitry employed for the analog signal path 18 can vary according to the filtering being performed and the application in which the filter is being implemented. Additionally, the analog signal path 18 can be configured upstream of the signal combiner 12, such that the analog processing occurs prior to the combination with the feedback signal 14. Furthermore, the digital signal DIG_OUT output from the ADC 26 can undergo additional digital processing, such as from a decimation filter, before being fed back to the digital feedback filter 28. Accordingly, the mixed-signal filter 10 can be configured in any of a variety of ways.

Figure 3:
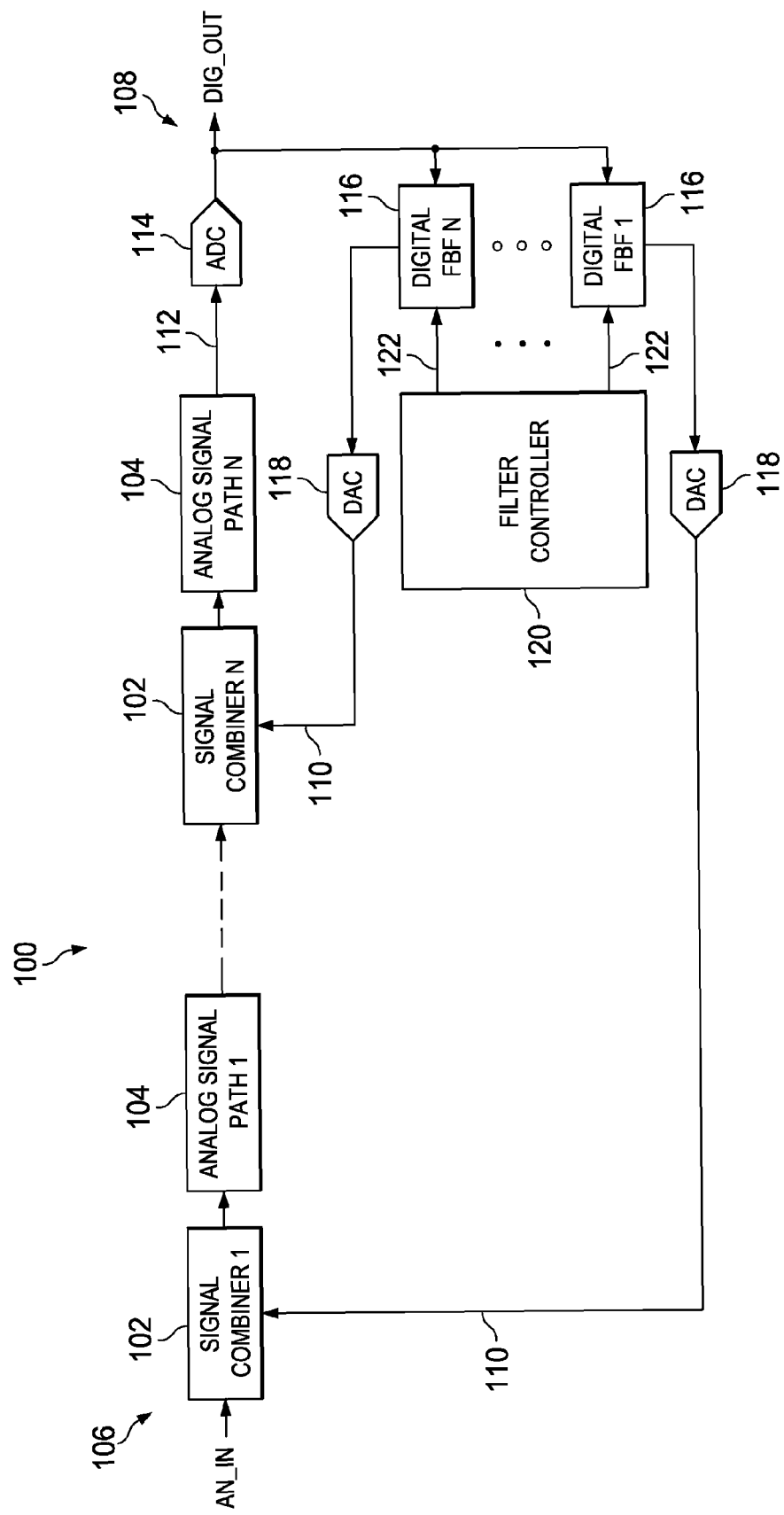
FIG. 3 illustrates another example of a mixed-signal filter in accordance with an aspect of the invention.

FIG. 3 illustrates another example of a mixed-signal filter 100 in accordance with an aspect of the invention. The mixed-signal filter 100 can be configured in any of a variety of devices, such as a handheld wireless communications device or other type of device. For example, the mixed-signal filter 100 can be configured in a wireless receiver, such that the mixed-signal filter 100 can operate to filter downconverted and/or demodulated signals received at an antenna, similar to as described above in the example of FIG. 1.

In the example of FIG. 3, the mixed-signal filter 100 receives an analog input signal AN_IN, which can be an RF signal that is downconverted to an IF analog communication signal. The mixed-signal filter 100 includes a plurality N of signal combiners 102 and a respective plurality N of analog signal paths 104 arranged in an alternating series path between an input 106 and an output 108 of the mixed-signal filter 100, where N is a positive integer. Each of the signal combiners 102 is configured to combine an input signal with one of a respective plurality N of feedback signals 110. Each of the analog signal paths 104 can be configured to separately process (e.g., filter and/or amplify) the combined signal output from the corresponding signal combiner 102 in the analog domain.

The analog input signal AN_IN is provided as the input signal to a first one of the signal combiners 102, demonstrated as SIGNAL COMBINER 1 in the example of FIG. 3. Because the signal combiners 102 and the analog signal paths 104 are configured in an alternate series path, the input signal provided to each of the remaining signal combiners 102 is a processed combined signal output from an upstream one of the analog signal paths 104. Therefore, each of the analog signal paths 104 after the first path, demonstrated as ANALOG SIGNAL PATH 1 in the example of FIG. 3, processes a combined signal that includes a cumulative combination of processed analog signals and feedback signals. As such, the last of the analog signal paths 104, demonstrated in the example of FIG. 3 as ANALOG SIGNAL PATH N, provides an output 112 that is a combination of all of the N feedback signals 110 and all of the processing performed by each of the analog signal paths 104. Each of the N paths can be considered a portion of an aggregate analog signal path that extends between the input at which AN_IN is provided and the output of the filter 100.

The processed analog signal 112 output from the ANALOG SIGNAL PATH N is provided to an ADC 114 configured to convert the processed analog signal 112 to the digital domain. Thus, the ADC 114 generates a digital signal DIG_OUT that is a digital version of the processed analog signal 112. The digital signal DIG_OUT is output from the mixed-signal filter 100, and is also provided to a plurality N of digital feedback filters 116. Each of the digital feedback filters 116 can be configured as a programmable digital filter that is operative to filter the digital signal DIG_OUT. The digitally filtered output from each of the digital feedback filters 116 is provided to a corresponding DAC 118, which converts each of the digitally filtered output signals to the analog domain to provide the corresponding feedback signals 110.

The mixed-signal filter 100 also includes a filter controller 120 configured to provide separate programming commands to each of the digital feedback filters 116 via separate control lines 122. As an example, each of the digital feedback filters 116 can be individually programmed by the filter controller 120 to set poles, zeros, and/or gain associated with the frequency spectrum of the digital signal DIG_OUT. The filter controller 120 can be configured to set the poles, zeros, and/or gain based on preset commands, such as set by a user or based on a specific known communication format or standard. As a result, each of the digital feedback filters 116 can separately contribute to an overall transfer function of the mixed-signal filter 100. In addition, because of the cascade configuration of the mixed-signal filter 100 (e.g., with regard to the cumulative combination of the feedback signals 110 with the processed combined signals output from the analog signal paths 104), the filter controller 120 can generate any of a variety of transfer functions that can be significantly more complex than that generated by the mixed-signal filter 10 in the example of FIG. 1. Furthermore, the filter controller 120 can be configured to program any of the digital feedback filters 116 dynamically, such as in response to detecting an interferer signal during run-time operation of the wireless communication device in which the mixed-signal filter 100 is included. Additionally or alternatively, the digital feedback filters can be programmed sequentially, such as part of an iterative process to mitigate the effect of one or more interferer signal during device operation. Alternatively, the digital feedback filters can be programmed during a calibration mode that may occur outside of a normal operating mode.

It is to be understood that the mixed-signal filter 100 is not intended to be limited to the example of FIG. 3. For example, the analog signal paths 104 can be individually configured in any of a variety of ways, such as by including separate combinations of analog filters and/or amplifiers, each with separate analog filter transfer functions. Additionally, the analog signal paths 104 can be configured upstream of the signal combiners 102. Furthermore, the digital signal DIG_OUT output from the ADC 114 can undergo additional digital processing, such as from a decimation filter, before being fed back to the digital feedback filters 116. Accordingly, the mixed-signal filter 100 can be configured in any of a variety of ways, which can vary according to application requirements.

Figure 4:
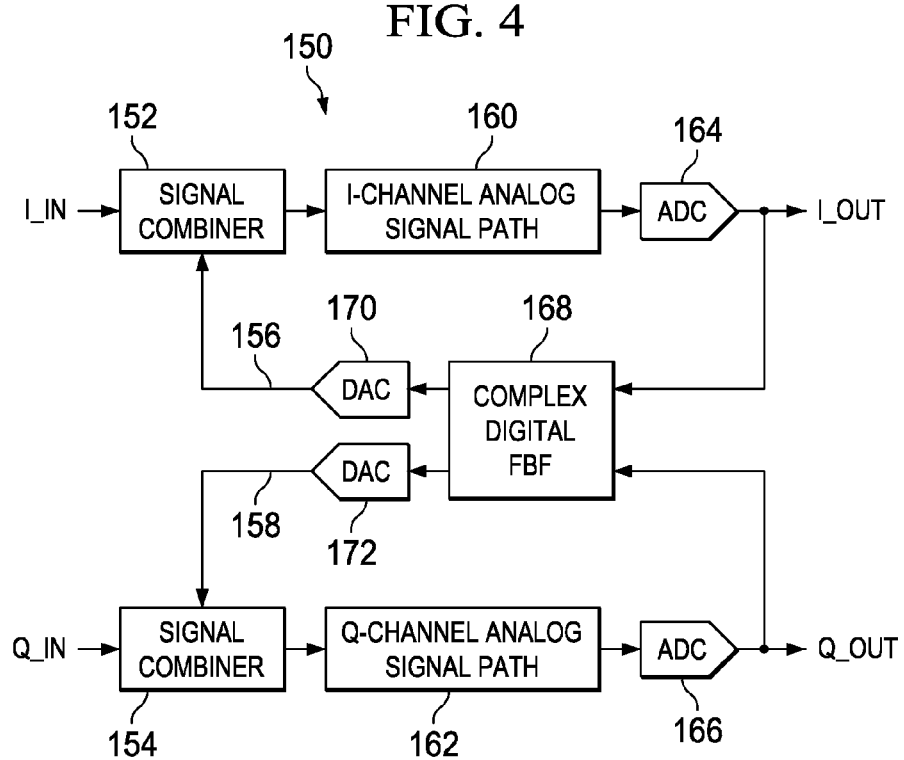
FIG. 4 illustrates another example of a mixed-signal filter in accordance with an aspect of the invention.

FIG. 4 illustrates another example of a mixed-signal filter 150 in accordance with an aspect of the invention. The mixed-signal filter 150 can be configured in any of a variety of communications devices, such as a handheld wireless communications device. For example, the mixed-signal filter 150 can be configured in a wireless receiver, such that the mixed-signal filter 150 can operate to filter downconverted and/or demodulated complex signals received at an antenna.

The mixed-signal filter 150 receives a complex analog input signal, demonstrated in the example of FIG. 4 as including an in-phase analog input signal component I_IN and a quadrature analog input signal component Q_IN. Each of the analog input signal components I_IN and Q_IN is provided to a signal combiner 152 and 154, respectively. The signal combiners 152 and 154 are each configured to combine the respective analog input signal components I_IN and Q_IN with respective analog feedback signals 156 and 158. As an example, the analog input signal components I_IN and Q_IN and the analog feedback signals 156 and 158 can be combined in the voltage domain, the current domain, or the charge domain. The signal combiners 152 and 154 can also each include one or more additional analog circuit components, such as an attenuator to reduce the combined power of the analog input signal components I_IN and Q_IN and the respective analog feedback signals 156 and 158.

The signal combiners 152 and 154 each provide combined signal outputs to an I-channel analog signal path 160 and a Q-channel analog signal path 162, respectively. The I-channel analog signal path 160 and Q-channel analog signal path 162 are each configured to process (e.g., filter and/or amplify)

the combined signals. The processed outputs of the I-channel analog signal path 160 and the Q-channel analog signal paths 162 are each provided to respective ADCs 164 and 166 that are each configured to convert the processed analog signals to the digital domain. Thus, the ADC 164 generates a digital signal I_OUT and the ADC 166 generates a digital signal Q_OUT. The digital signals I_OUT and Q_OUT are output from the mixed-signal filter 150, such that they can each be provided to any of a variety of additional processing devices. The digital signals I_OUT and Q_OUT are also each provided to a complex digital feedback filter 168. The complex digital feedback filter 168 can be configured as a programmable digital filter that is operative to filter both the in-phase digital signal I_OUT and the quadrature digital signal Q_OUT. Similar to as described above in the examples of FIGS. 1 and 3, the mixed-signal filter 150 can include a filter controller (not shown) configured to provide programming commands to the complex digital feedback filter. The digitally filtered outputs of the complex digital feedback filter 168 are each provided to corresponding DACs 170 and 172, respectively, which each convert the digitally filtered output signals to the analog domain as the corresponding respective feedback signals 156 and 158.

Figure 5:
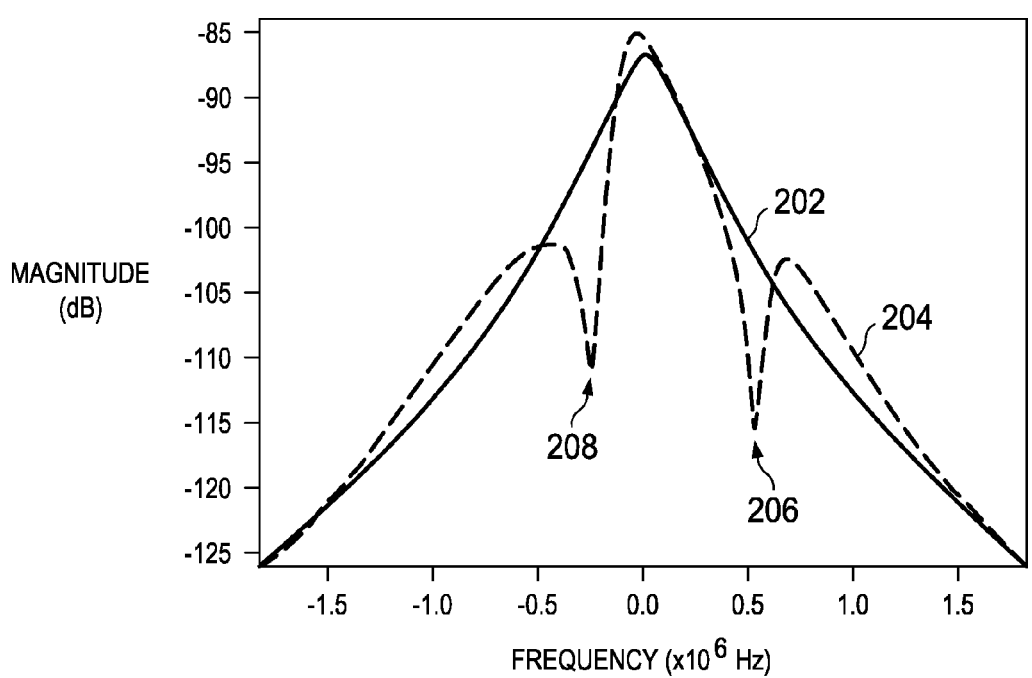
FIG. 5 illustrates another example of a graph of a transfer function of a mixed-signal filter in accordance with an aspect of the invention.

As a result of the filtering of the digital output signals I_OUT and Q_OUT, the complex digital feedback filter can provide a transfer function that is asymmetric about zero frequency, thus providing a complex transfer function of the mixed-signal filter 150. FIG. 5 illustrates an example of a graph 200 of a transfer function of a mixed-signal filter in accordance with an aspect of the invention. The graph 200 can be representative of a transfer function of the mixed-signal filter 150 in the example of FIG. 4. As such, reference will be made to the mixed-signal filter 150 in the example of FIG. 4 in the discussion of the graph 200 in the example of FIG. 5.

The transfer function demonstrated by the graph 200 includes a PSD function that plots a magnitude of the PSD of the complex digital output signal components I_OUT and Q_OUT in dB over frequency in $10^6$ Hz. The graph 200 demonstrates a first curve 202, indicated in the example of FIG. 5 as a solid line. The first curve 202 can be representative of a transfer function of an open-loop filtering of the complex analog input signal components I_IN and Q_IN. As an example, the first curve 202 can be representative of an open-loop transfer function of an analog filter that is included in the I-channel analog signal path 160 and the Q-channel analog signal path 162. In addition, the first curve 202 is symmetric about zero frequency, such that it is a computationally simple transfer function. Thus, as demonstrated in the example of FIG. 5, the first curve 202 can represent a simple open-loop analog filter transfer function.

The graph 200 also demonstrates a second curve 204, indicated in the example of FIG. 5 as a dashed line. The second curve 204 can be representative of a closed-loop transfer function of the entire mixed-signal filter 150 of the example of FIG. 4. In the example of FIG. 5, the complex digital feedback filter 168 is demonstrated as a fourth-order complex IIR filter, with a frequency response that is asymmetric with respect to direct current (DC). As an example, the transfer function of the second curve 204 in the z-domain can be represented by Equation 3 as follows:

$$FBF(z) = \frac{0.4486 - (1.386 + 0.0403i)z^{-1} + (1.558 + 0.0906i)z^{-2} - (0.7523 + 0.0657i)z^{-3} + (0.1316 + 0.0154i)z^{-4}}{1 - (2.6138 + 0.0759i)z^{-1} + (2.3392 + 0.136i)z^{-2} - (0.8212 + 0.0717i)z^{-3} + (0.0988 - 0.0115i)z^{-4}}$$

Equation 3

As a further example, the transfer function of the second curve 204 can also be expressed in a zero/pole/gain (zpk) format based on Equation 3 as shown below in Equation 4:

$$FBF(z) = 0.4486 \frac{(z - (0.9996 + 0.0290i))(z - (0.9908 + 0.0288i))(z - (0.6161 + 0.0179i))(z - (0.4832 + 0.014i))}{(z - (0.9892 + 0.1128i))(z - (0.9941 - 0.0552i))(z - (0.3144 + 0.0393i))(z - (0.3161 - 0.021i))}$$

Equation 4

Where $i = \sqrt{-1}$.

As demonstrated in the example of FIG. 2, the digital feedback filter 168 has four zeros and four poles. However, because the digital filter 168 is a complex filter, the four zeros and the four poles are not in complex-conjugate pairs. Therefore, the digital feedback filter 168 in the example of FIG. 5 is demonstrated as a fourth-order complex IIR filter. In addition, in the example of FIG. 5, the DACs 170 and 172 are each demonstrated as being a second-order sigma-delta DAC, such that second-order sigma-delta modulation is applied to both the in-phase path and the quadrature-phase path of the mixed-signal filter 150.

As an example, the complex digital feedback filter 168 can be programmed to set zeros at approximately 530 kHz and at approximately −270 kHz, such as in response to known and/or detected interferer signals in the complex analog input signal components I_IN and Q_IN. The zeros at approximately 530 kHz and −270 kHz are thus asymmetric about zero frequency, and thus suitable to generate a complex transfer function. Therefore, upon combination of the feedback signals 156 and 158 with the analog input signal components I_IN and Q_IN, the zeros programmed at approximately 530 kHz and −270 kHz combine with the transfer function demonstrated by the first curve 202 to generate an asymptotic notch 206 at approximately 530 kHz and an asymptotic notch 208 at approximately −270 kHz. Accordingly, the mixed-signal filter 150 can be set with the predetermined complex transfer function demonstrated by the second curve 204 for the digital output signal DIG_OUT to remove the interferer signals at or near approximately 530 kHz and/or −270 kHz.

It is to be understood that the mixed-signal filter 150 is not intended to be limited to the example of FIGS. 4 and 5. For example, the I-channel analog signal path 160 and the Q-channel analog signal path 162 can each include any of a variety of analog signal processing circuitry not demonstrated in the example of FIG. 4, such as filters and/or amplifiers, similar to the example of FIG. 1. Additionally, the I-channel analog signal path 160 and the Q-channel analog signal path 162 can each be configured upstream of the respective signal combiners 152 and 154, such that the analog processing occurs prior to the combination with the respective feedback signals 156 and 158. In addition, the complex digital feedback filter 168 can be configured as two separate components, one for each of the digital signal I_OUT and the digital signal Q_OUT. Furthermore, each of the digital signals I_OUT and Q_OUT output from the respective ADCs 164 and 166 can undergo additional digital processing, such as from a decimation filter, before being fed back to the complex digital feedback filter 168. Accordingly, the mixed-signal filter 150 can be configured in any of a variety of ways.

Figure 6:
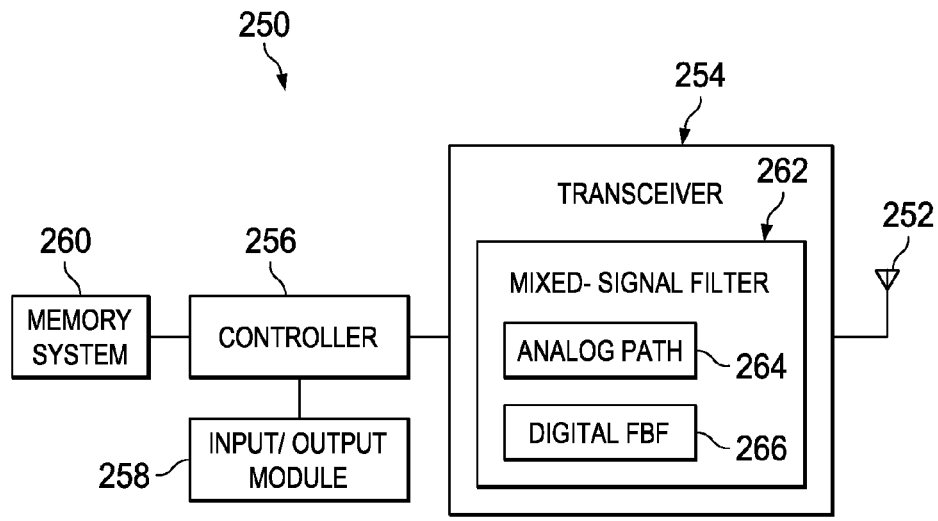
FIG. 6 illustrates an example of a wireless communication device in accordance with an aspect of the invention.

A mixed-signal filter that is configured to provide efficient signal filtering based on a combination of analog and digital algorithms, such as the mixed-signal filters 10, 100, and 150 in the examples of FIGS. 1, 3, and 4, respectively, can be utilized in any of a variety of applications. An example of such an application is depicted in FIG. 6. FIG. 6 illustrates an example of a wireless communication device 250, such as a cellular telephone. Wireless signals are transmitted from and received at an antenna 252. The wireless communication device 250 also includes a transceiver 254, a controller 256, and an input/output module 258, which could include a microphone and speaker. Wireless signals received at the antenna 252 are downsampled and/or demodulated at the transceiver 254 and sent to the controller 256, such that the signals can be properly interpreted by the controller 256, such as voice data for a user of the wireless communication device 250 at the input/output module 258. Similarly, user voice signals from the input/output module 258 can be sent to the transceiver 254 via the controller 256 to be modulated into a wireless signal that is transmitted from the antenna 252. The wireless communication device 250 also includes a memory 260, which could include both volatile and non-volatile memory. The memory 260 can be configured to store configuration data and/or application parameters for a given communication session of the wireless communication device 250.

In the example of FIG. 6, the transceiver 254 includes a mixed-signal filter 262. The mixed-signal filter 262 can be configured substantially similarly to any of the mixed-signal filters 10, 100, and 150 in the examples of FIGS. 1, 3, and 4. For example, analog input signals received at the antenna 252 can be down-converted and provided to the mixed-signal filter 262. The mixed-signal filter 262 can include an analog signal path 264 and a digital feedback filter 266, demonstrated in the example of FIG. 6 as DIGITAL FBF 266. The digital feedback filter 266 can be programmed with at least one of zeros, poles, and gain across the frequency spectrum associated with the analog input signal. Thus, the analog input signal can be combined in the mixed-signal filter 262 with a feedback signal output from the digital feedback filter 266. The combined signal is processed in the analog domain via the analog signal path 264 to generate an output signal. The output signal is thus filtered in the digital domain by the digital feedback filter 266 to generate the feedback signal. Therefore, the mixed-signal filter can be programmed to generate a predetermined transfer function for the analog input signal, such as demonstrated in the examples of FIGS. 2 and 5.

It is to be understood that the mixed-signal filter 262 is not limited to use for analog input signals received at the antenna 252. For example, the mixed-signal filter 262 can be implemented in the transceiver 254 to filter outgoing signals that are to be transmitted from the antenna 252, as well. Furthermore, the mixed-signal filter 262 is not limited to use within the transceiver 254, but can be implemented for any analog filtering application within the wireless communication device 250, or any other of a variety of electronic devices that incorporate analog filtering.

Figure 7:
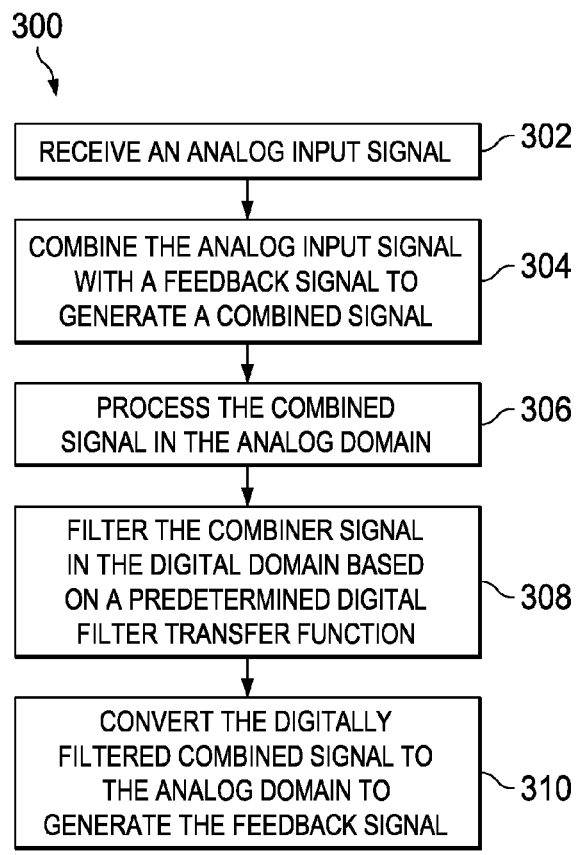
FIG. 7 illustrates an example of a method for filtering an analog signal in accordance with an aspect of the invention.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., analog or digital circuitry, such as may be embodied in an application specific integrated circuit or a computer system), software (e.g., as executable instructions stored on a computer readable media or running on one or more computer systems), or any combination of hardware and software.

FIG. 7 illustrates an example of a method 300 for filtering an analog signal in accordance with an aspect of the invention. At 302, an analog input signal is received. The analog input signal can be a downconverted and/or demodulated RF signal received at an antenna. The analog input signal can be real or complex. At 304, the analog input signal is combined with a feedback signal to generate a combined signal. The combining of the analog input signal and the feedback signal (at 304) can be implemented in one of the voltage domain, current domain, or charge domain. At 306, the combined signal is processed in the analog domain. The analog processing of the combined signal can include analog filtering and/or amplification of the combined signal.

At 308, the combined signal is filtered in the digital domain based on a predetermined digital filter transfer function. The predetermined digital filter transfer function can be programmable to set zeros, poles, and/or gain of the combined signal in the digital domain. The programming of the predetermined digital filter transfer function can occur during run-time operation of the wireless communication device in which the method 300 is implemented. At 310, the digitally filtered combined signal is converted to the analog domain to generate the feedback signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A mixed-signal filter comprising:
an analog signal path configured to filter a first analog signal in the analog domain and provide a filtered first analog signal;
an analog-to-digital converter (ADC) configured to convert the filtered first analog signal to a digital signal;
a programmable digital feedback filter configured to filter the digital signal and provide a filtered digital signal;
a digital-to-analog converter (DAC) configured to convert the filtered digital signal to a second analog signal; and
a signal combiner configured to combine an analog input signal of the mixed-signal filter and the second analog signal to generate the first analog signal.

2. The mixed-signal filter of claim 1, wherein the signal combiner is configured to combine the analog input signal and the second analog signal in the charge domain.

3. The mixed-signal filter of claim 1, wherein the programmable digital feedback filter is configured to be programmed to set at least one of poles, zeros, and gain of a frequency spectrum associated with the digital signal, such that the mixed-signal filter has a predetermined transfer function based on the at least one of the poles, zeros, and gain.

4. The mixed-signal filter of claim 1, wherein the programmable digital feedback filter is configured to be programmed during run-time operation of the mixed-signal filter.

5. The mixed-signal filter of claim 1, wherein the analog signal path is an in-phase analog signal path and the signal combiner is an in-phase signal combiner, the mixed-signal filter further comprising:
a quadrature analog signal path configured to process a first quadrature analog signal; and a quadrature signal combiner configured to combine an analog quadrature input signal of the mixed-signal filter and a second quadrature analog signal to generate the first quadrature analog signal;

and wherein the programmable digital feedback filter is configured to filter an in-phase digital signal and a quadrature digital signal.

6. The mixed-signal filter of claim 1, wherein the signal combiner is a first signal combiner, the analog signal path being a first analog signal path, and, the programmable digital feedback filter is a first programmable digital feedback filter the mixed-signal filter further comprising:
   at least one additional signal combiner;
   a respective at least one additional analog signal path, each of the at least one additional signal combiner and each of the respective at least one additional analog signal path being alternately configured in series with the first signal combiner and the first analog signal path;
   a respective at least one additional programmable digital feedback filter each configured to filter the digital signal, such that each of the at least one additional signal combiners is configured to combine a separately filtered second analog signal and a processed analog signal output from one of the first analog signal path and one of the at least one additional analog signal path.

7. The mixed-signal filter of claim 6, wherein each of the at least one additional programmable feedback filter is separately programmable to set at least one of poles, zeros, and gain of a frequency spectrum associated with the digital signal to generate a predetermined transfer function of the mixed-signal filter.

8. A wireless communication device comprising the mixed-signal filter of claim 1.

9. A method for filtering a first analog signal, the method comprising:
   combining the first analog signal with a second analog signal to generate a combined analog signal;
   filtering the combined analog signal in the analog domain;
   converting the filtered combined analog signal to a digital signal;
   filtering the digital signal in the digital domain in a programmable digital filter based on a predetermined digital filter transfer function; and
   converting the filtered digital signal to the analog domain to generate the second analog signal.

10. The method of claim 9, further comprising programming a digital filter to set at least one of poles, zeros, and gain of a frequency spectrum associated with the digital signal to achieve the predetermined digital filter transfer function.

11. The method of claim 10, wherein programming the digital filter comprises programming the digital filter during run-time operation.

12. The method of claim 9, wherein the first analog signal comprises an in-phase analog signal and a quadrature analog signal and wherein combining the first analog signal comprises combining the in-phase analog signal with the second analog signal to generate a first combined analog signal, the method further comprising:
   combining the quadrature analog signal with a fourth analog signal to generate a second combined analog signal;
   processing the second combined analog signal in the analog domain to provide a processed second combined analog signal;
   converting the processed second combined analog signal to a second digital signal;
   filtering the second digital signal in the digital domain based on the predetermined digital filter transfer function; and
   converting the filtered second digital signal to the analog domain to generate the fourth analog signal.

13. The method of claim 9, wherein filtering the digital signal comprises separately filtering the digital signal based on a plurality of predetermined digital filter transfer functions to generate a plurality of separately filtered digital signals, and wherein converting the filtered digital signal comprises converting the plurality of separately filtered digital signals to the analog domain to generate a plurality of filtered analog signals, the method further comprising processing a plurality of combined analog signals in series, each of the plurality of combined analog signals being generated by combining each of the plurality of filtered analog signals with a respective upstream one of the plurality of combined analog signals.

14. A mixed-signal filter comprising:
   means for combining an analog input signal and a feedback signal to generate an analog combined signal;
   means for filtering the analog combined signal in the analog domain to generate an output signal;
   means for filtering the output signal in the digital domain to generate the feedback signal based on a predetermined transfer function; and
   means for programming the means for filtering to generate the predetermined transfer function.

15. The mixed-signal filter of claim 14, wherein the means for programming comprises means for programming the means for filtering to generate the predetermined transfer function during run-time operation of the mixed-signal filter.

16. The mixed-signal filter of claim 14,
   wherein the means for combining further comprises:
      means for combining an in-phase version of the analog input signal and an in-phase feedback signal to generate an in-phase analog combined signal; and
      means for combining a quadrature version of the analog input signal and a quadrature feedback signal to generate a quadrature analog combined signal,
   wherein the means for processing further comprises:
      means for processing the in-phase analog combined signal to generate an in-phase output signal; and
      means for processing the quadrature analog combined signal to generate a quadrature output signal, and
   wherein the means for filtering further comprises means for filtering the in-phase output signal and the quadrature output signal in the digital domain to generate the in-phase feedback signal and the quadrature feedback signal based on the predetermined transfer function.

17. The mixed-signal filter of claim 14, wherein the means for filtering comprises plural means for filtering the output signal in the digital domain to generate a plurality of feedback signals based on a respective plurality of predetermined transfer functions, and wherein the means for combining comprises plural means for combining one of the plurality of feedback signals with one of a plurality of combined signals output from an upstream one of the plural means for combining to generate a respective one of a plurality of analog combined signals.

* * * * *